US007050354B2

(12) United States Patent
Nicholes

(10) Patent No.: US 7,050,354 B2
(45) Date of Patent: May 23, 2006

(54) LOW-POWER COMPILER-PROGRAMMABLE MEMORY WITH FAST ACCESS TIMING

(75) Inventor: James W. Nicholes, Gilbert, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 124 days.

(21) Appl. No.: 10/737,058

(22) Filed: Dec. 16, 2003

(65) Prior Publication Data

US 2005/0128836 A1    Jun. 16, 2005

(51) Int. Cl.
*G11C 7/00* (2006.01)
(52) U.S. Cl. .................. 365/263; 365/194; 365/204
(58) Field of Classification Search ............. None
See application file for complete search history.

(56) References Cited

U.S. PATENT DOCUMENTS

| 5,270,978 | A | * | 12/1993 | Matsumoto et al. ........ 365/203 |
| 5,434,822 | A |   | 7/1995  | Deleganes et al. |
| 5,627,788 | A | * | 5/1997  | Chang et al. ............. 365/204 |
| 5,703,820 | A | * | 12/1997 | Kohno .................... 365/204 |
| 5,757,709 | A | * | 5/1998  | Suminaga et al. ......... 365/204 |
| 5,856,949 | A |   | 1/1999  | Jiang |
| 6,018,487 | A | * | 1/2000  | Lee et al. ................ 365/204 |
| 6,191,979 | B1 | * | 2/2001  | Uekubo ................. 365/185.25 |
| 6,282,114 | B1 | * | 8/2001  | Hanriat et al. ............ 365/103 |
| 6,285,590 | B1 |   | 9/2001  | Poplevine et al. |
| 6,301,176 | B1 |   | 10/2001 | Brown |
| 6,487,124 | B1 | * | 11/2002 | Semi .................... 365/185.25 |
| 6,754,122 | B1 | * | 6/2004  | Wada et al. ............. 365/207 |
| 6,781,904 | B1 | * | 8/2004  | Lee et al. ............... 365/207 |

FOREIGN PATENT DOCUMENTS

WO    WO 2004/015713 A1    2/2004

* cited by examiner

*Primary Examiner*—Tan T. Nguyen

(57) ABSTRACT

A low-power, compilable memory uses a charging pulse technique to improve access times over other low-power memory implementations. The memory includes circuitry configured to discharge a plurality of bit lines during an inactive memory access period to reduce power consumption. The memory also includes other circuitry that applies a charging pulse during an active memory access period on a select one of the plurality of bit lines in order to improve the memory access times. An automatic memory compiler adjusts a timing circuit to control the duration of the charging pulse and the enabling of a sense amplifier circuit during memory design. The memory compiler provides a programmable physical size of the memory and optimizes the access timing while ensuring reliable sensing. The compiler calculates timing for the timing circuit according to a mathematical formula that provides for highly accurate and predicable access time delays for multiple memory configurations.

23 Claims, 6 Drawing Sheets

US 7,050,354 B2

LOW-POWER COMPILER-PROGRAMMABLE MEMORY WITH FAST ACCESS TIMING

BACKGROUND

1. Field of the Disclosure

The present disclosure relates generally to integrated circuit memories, and more particularly to a memory having a low power read cycle and fast access timing.

2. Description of the Related Art

With today's information systems, it is preferable to minimize the power consumed by a memory device utilized in the information system. A low power memory device is especially desirable in battery powered systems or systems susceptible to over-heating. Another desirable feature for memory devices is reduced access time. Reducing the access time of a memory device enables a system utilizing the memory device to operate at faster speeds. However, these two desirable features are in conflict with each other. For example, in conventional memory devices, reducing power consumption typically increases the memory access time.

Providing a memory device that consumes less power and has fast access times is further complicated when providing compilable memory. Compilable memory refers to a memory module provided, for example, in a computer aided design (CAD) environment that allows a designer to select a physical size of a memory array during the design of an application specific integrated circuit (ASIC). Because an implemented memory module can vary in physical size, for example from 256 words to 64 k words, the memory module should advantageously scale access times appropriately. What is desirable is a memory device that is low power, has fast access times and can be efficiently provided as compilable memory.

BRIEF DESCRIPTION OF THE DRAWINGS

The present disclosure may be better understood, and its numerous features and advantages made apparent to those skilled in the art by referencing the accompanying drawings.

The use of the same reference symbols in different drawings indicates similar or identical items.

DESCRIPTION OF THE PREFERRED EMBODIMENT(S)

A low-power, compilable memory using a charging pulse technique to improve access times over other low-power memory implementations is provided. The memory includes circuitry configured to discharge a plurality of bit lines during an inactive memory access period to reduce power consumption. The memory also includes other circuitry that applies a charging pulse during an active memory access period on a select one of the plurality of bit lines prior to sensing a voltage difference between the select one of the plurality of bit lines and a reference signal in order to improve the memory access times. The memory includes a two stage timing circuit to control the duration of the charging pulse and the enabling of a sense amplifier. An automatic memory compiler adjusts the timing circuit during memory design. The memory compiler provides a programmable physical size of the memory and optimizes the access timing while ensuring reliable sensing. The compiler calculates timing for the two stage timing circuit according to a mathematical formula that provides for highly accurate and predicable access time delays for multiple memory configurations.

Figure 1:
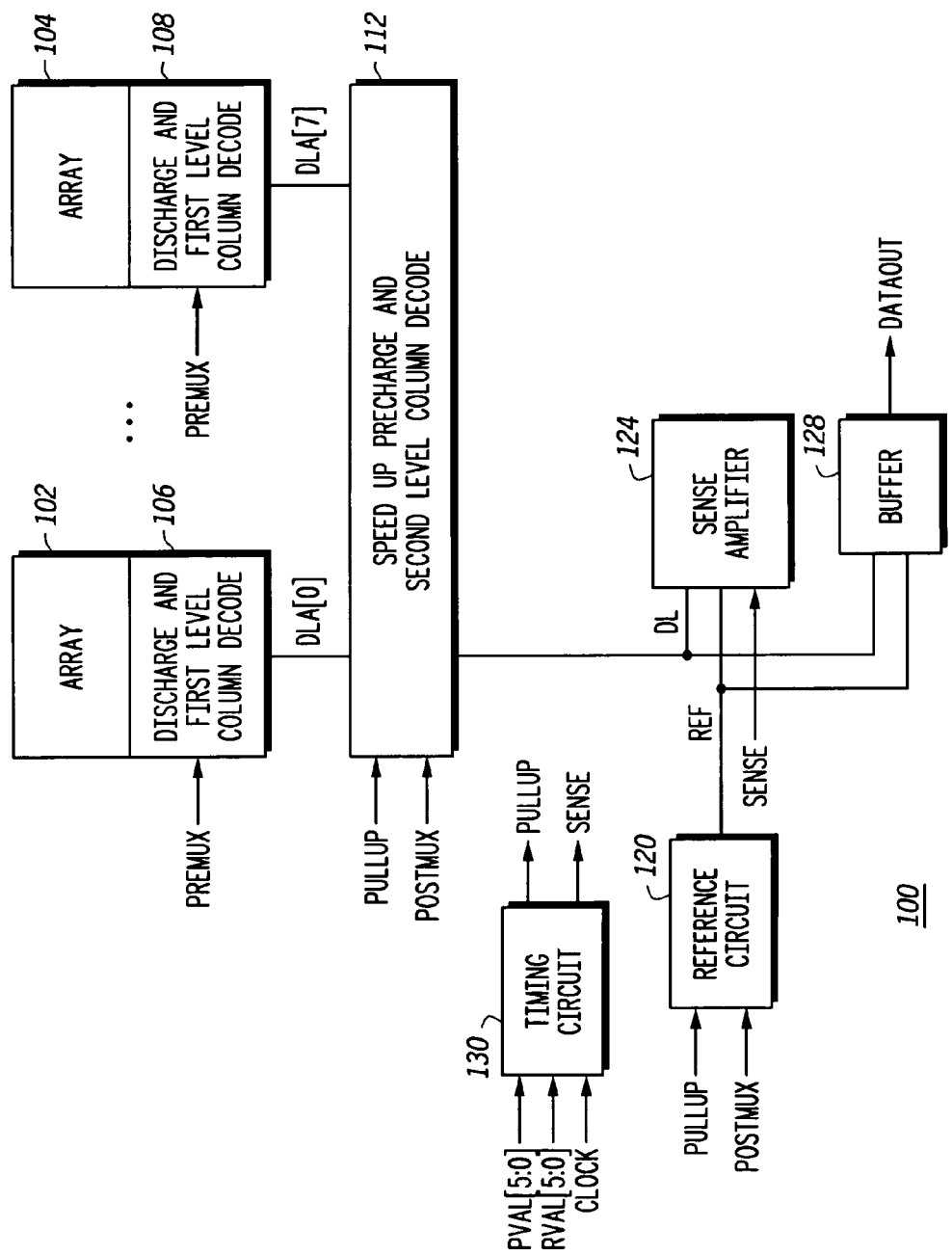
FIG. 1 illustrates, in block diagram form, a memory in accordance with the present invention.

FIG. 1 illustrates, in block diagram form, a memory 100 in accordance with one embodiment of the present invention. In the illustrated embodiment, memory 100 is a mask programmable read only memory (ROM). However, in other embodiments, memory 100 may be another memory type. Memory 100 includes a plurality of memory arrays including memory arrays 102 and 104. Note that although two memory arrays are illustrated in FIG. 1, more memory arrays and corresponding discharge and data line decode circuits may be present in other embodiments. For example, in memory 100 there are 8 memory arrays. In another embodiment, there can be more or less than 8 memory arrays.

Discharge and first level column decode circuit 106 is coupled to memory array 102 and discharge and first level column decode circuit 108 is coupled to memory array 104. Discharge and first level column decode circuits 106 and 108 function to both control bit line discharge during inactive memory access periods and the coupling of a bit line to speed-up precharge and bit line decode 112 in response to a column decode signal PREMUX via a data line labeled DLA[0] or DLA[7], respectively, during active memory access periods.

Speed-up precharge and bit line decode 112 precharges a selected one of the data lines, such as for example, data line DLA[0] in response to speed-up precharge signal PULLUP during active memory access periods. Speed-up precharge and bit line decode 112 couples data line DLA[0] to sense amplifier 124 in response to a column decode signal labeled POSTMUX. The decoded bit line is precharged by the precharging of the decoded data line.

Reference circuit 120 also receives speed-up precharge signal PULLUP and column address signal POSTMUX and provides a reference current REF to sense amplifier 124 during a read cycle of memory 100.

Sense amplifier 124 has input/output terminals for receiving reference signal REF and a data line signal labeled DL. During a read cycle of memory 100, sense amplifier 124 compares reference current REF to data line current DL to determine the logic state of a selected memory location. Buffer 128 is coupled to data line DL and reference line REF and receives a data signal corresponding to the state of the selected memory location. In response, buffer 128 provides a buffered data out signal labeled DATA OUT. Buffer 128 can contain a latching circuit to store data for the remainder of a cycle, once sense amplifier 124 has sensed the DL/REF differential.

Timing circuit 130 provides accurate timing for the PULLUP and SENSE signals. The duration of the charging pulse PULLUP is controlled such that the DL and REF nodes are first drawn to a midpoint voltage. The enabling of a sense amplifier is delayed from the end of the PULLUP charging pulse to allow sufficient time for the DL and REF nodes to separate towards their DC levels unassisted. The width of PULLUP signal and the delay between PULLUP becoming inactive and SENSE becoming active (the self timing delay) are finely tuned to balance the need for fast access times and the need to allow the signals to properly reflect the value stored in the memory.

Figure 2:
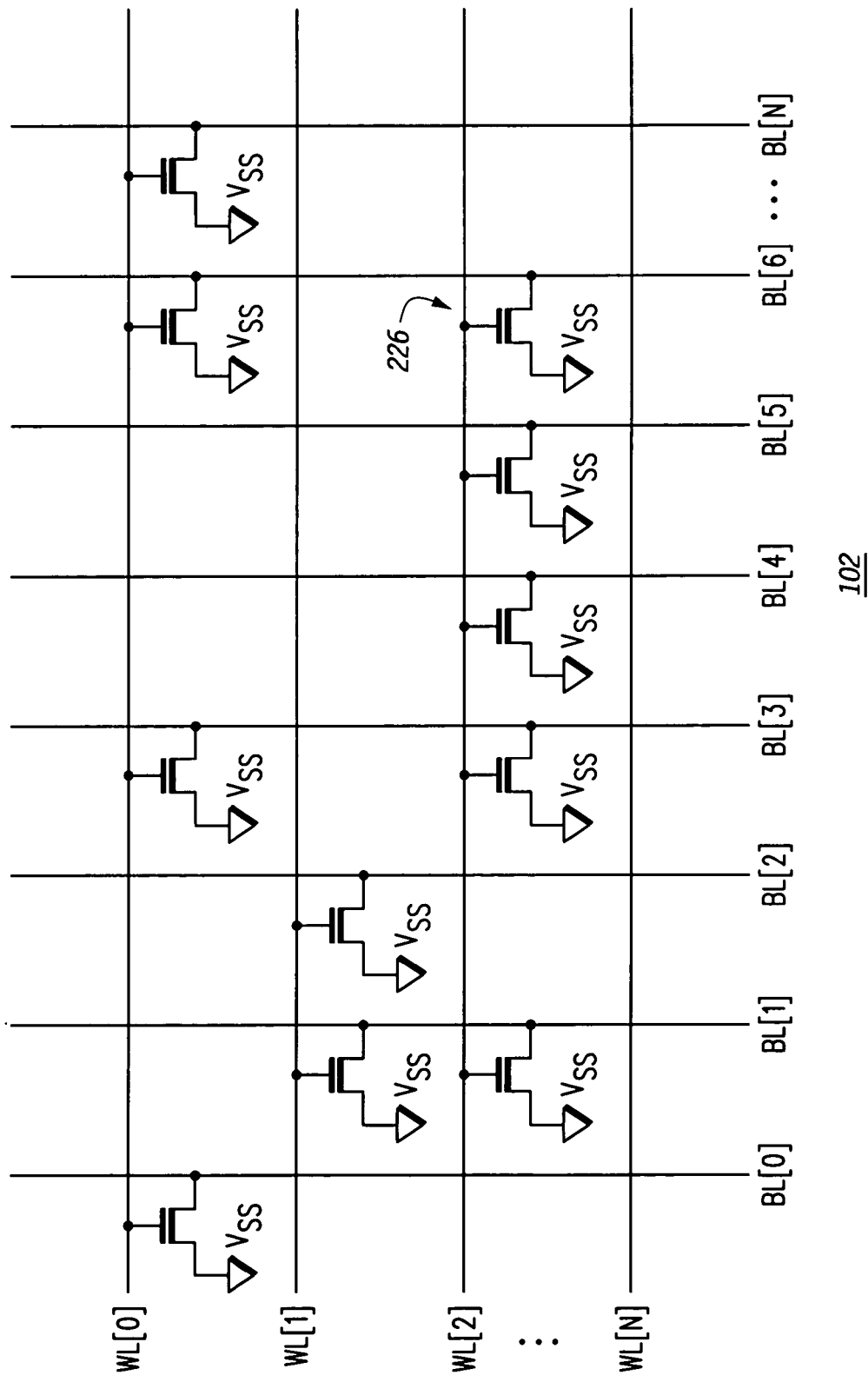
FIG. 2 illustrates, in schematic diagram form, a representative portion of the memory array of the memory of FIG. 1.

FIG. 2 illustrates, in schematic diagram form, a representative portion of memory array 102 of memory 100 of FIG. 1. Memory array 102 includes a plurality of word lines, including word lines labeled WL[0] through WL[N], extending in one direction. A plurality of bit lines, including bit lines labeled BL[0] through BL[N], extends in another direction across the word lines. Memory array 100 is a mask programmable ROM and a transistor, such as for example transistor 226, is coupled to a word line and a bit line at predetermined intersections of the word lines and bit lines depending on the particular data being stored in memory array 102. In the illustrated embodiment, a transistor is located at address locations that are intended to provide a low logic state corresponding to a logic "0" when read. Locations that do not have a transistor will be read as a high logic state corresponding to a logic "1" when read. By way of example, transistor 226 has a gate coupled to a word line labeled WL[2], a drain coupled to bit line BL[6], and a source coupled to $V_{SS}$. The other transistors are connected to the bit lines and word lines randomly and are not intended to reflect any particular data. In the illustrated embodiment, $V_{SS}$ is coupled to ground potential and $V_{DD}$ is coupled to a positive supply voltage, such as for example 1.5 volts. Note that memory array 100 is illustrated as a diffusion ROM. One skilled in the art will recognize that the present disclosure can beneficially be applied to other types of memory arrays, for example, contact ROM arrays.

Figure 3:
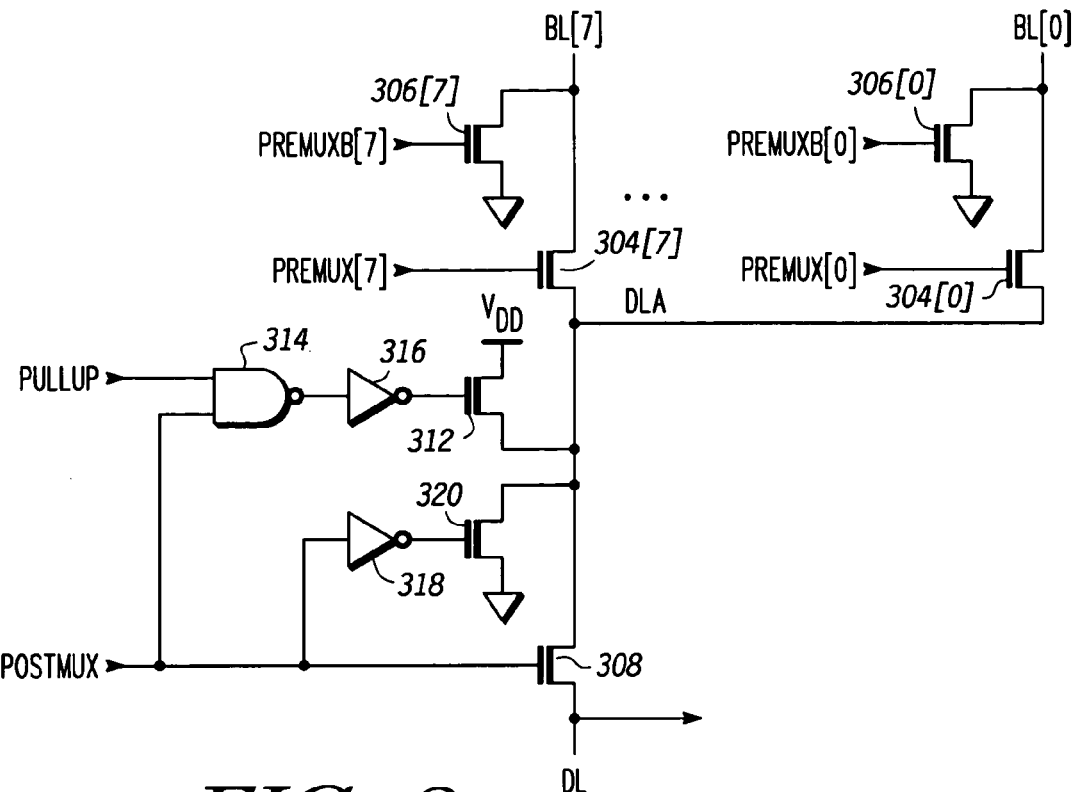
FIG. 3 illustrates, in schematic diagram form, a portion of the discharge and column decode and speed-up precharge and bit line decode circuits of the memory of FIG. 1.

FIG. 3 illustrates, in schematic diagram form, a portion of the discharge and first level column decode 106 and speed-up precharge and bit line decode 112 circuits of the memory of FIG. 1. Column decode transistors 304[7:0] receive one of first level column decode signals PREMUX[7:0], respectively. In addition, the inverses of PREMUX[7:0], that is, PREMUXB[7:0], are provided to discharge NMOS transistors 306[7:0], respectively. In the illustrated embodiment, discharge transistors 306[7:0] are coupled to corresponding bit lines BL[7:0] of memory array 102 in FIG. 2 in response to deasserted column decode signals PREMUX[7:0], for example, during inactive memory access periods. Discharge transistor 306[7] has a drain coupled to bit line BL[7], a gate coupled to PREMUXB[7], and a source coupled to $V_{SS}$. When inactive, POSTMUX signal drives inverter 318 which drives discharge NMOS transistor 320, discharging node DLA. Thus, all bit lines BL[7:0] and the DLA node are discharged low before a read operation begins.

During an active memory access period, one of bit lines BL[7:0] is coupled to data line DLA when a corresponding one of the column decode signals PREMUX[7:0] is asserted. Data line DLA is coupled to data line DL via transistor 308 in response to column decode signal POSTMUX being asserted. Column decode signal POSTMUX is the second level of column decoding. Transistor 308 has a first drain/source terminal connected to data line DLA, a second drain/source terminal connected to data line DL, and a gate coupled to receive second level column decode signal POSTMUX. PULLUP signal becomes active for a specified amount of time at the beginning of a read cycle, enabling pullup NMOS transistor 312 through NAND gate 314 and inverter 316. When active, a POSTMUX signal enables pass gate NMOS transistor 308. When a read operation begins, only one of discharge transistors 306[7:0] turn off while the others remain active, and the corresponding one of pass gates 304[7:0] and pass gate 308 turn on. The selected bit line and node DL are pulled towards Vss due to discharged bit line capacitance. To decrease the effect of the discharge capacitance and the time required for node DL to rise towards its DC level (for sensing a logic "1"), the PULLUP signal having a programmable pulse width brings node DLA to a midpoint voltage, for example, Vdd/2, provided through transistor 312, and decoded through NAND gate 314 and inverter 316. Following the pull-up, a short self-timing delay occurs prior to enabling the sense amplifier to allow, for example, approximately 100 mV of differential to occur between nodes DL and REF.

Figure 4:
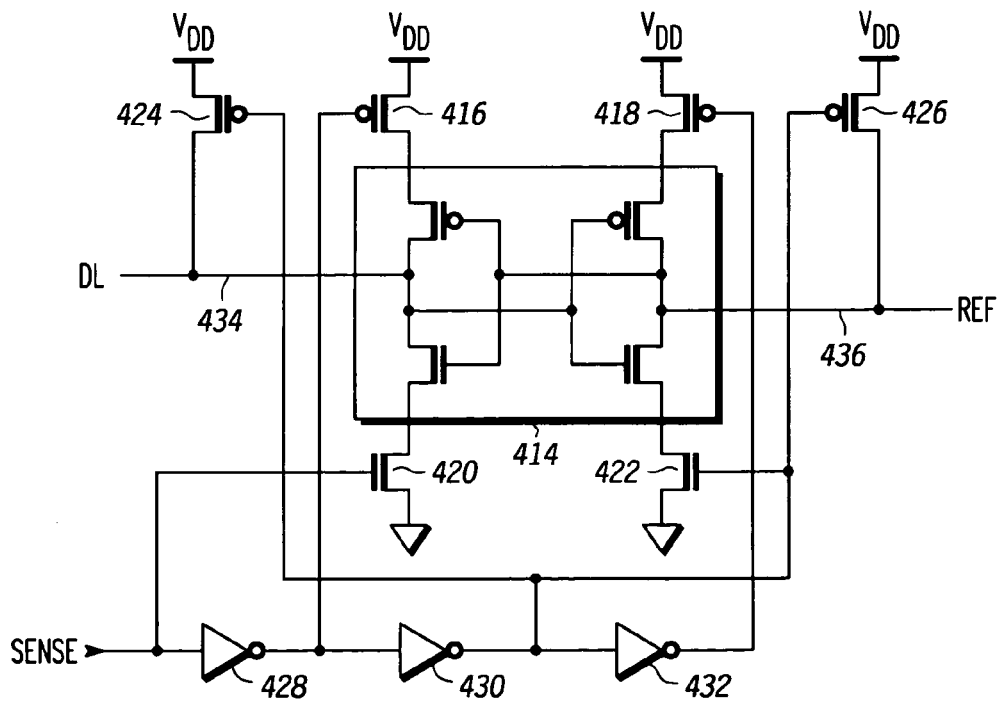
FIG. 4 illustrates, in schematic diagram form, the differential sense amplifier of FIG. 1.

FIG. 4 illustrates, in schematic diagram form, the differential sense amplifier of FIG. 1. The sense amplifier includes cross-coupled latch 414, P-channel transistors 416, 418, 424, and 426, N-channel transistors 420 and 422, and inverters 428, 430, and 432. Cross-coupled latch 414 includes a pair of conventional cross-coupled inverters. P-channel transistors 416 and 418 and N-channel transistors 420 and 422 couple cross-coupled latch 414 to $V_{DD}$ and Vss, respectively, in response to a logic high sense enable signal SENSE. Inverters 428, 430, and 432 are used to invert the logic level of sense enable signal SENSE to make P-channel transistors 416, 418, 424, and 426 conductive from the logic high sense enable signal SENSE. Nodes 434 and 436 function as both input and output terminals for cross-coupled latch 414. P-channel transistors 424 and 426 provide current sources for the reference line and the data line during a read cycle.

The differential voltage between the multiplexed bit line (DL) and the reference line (REF) is detected by sense amplifier 400, and converted to a logic "0" or "1", which is registered and passed to an output driver.

For stability and reliability, the sense signal is configured to enable the sense amplifier to sense when, for example, 100 mV of differential has been developed between nodes DL and REF. The timing delay can allow for 100 mV, 150 mV, 200 mV or any other differential reliably sensed by the sense amplifier.

Figure 5:
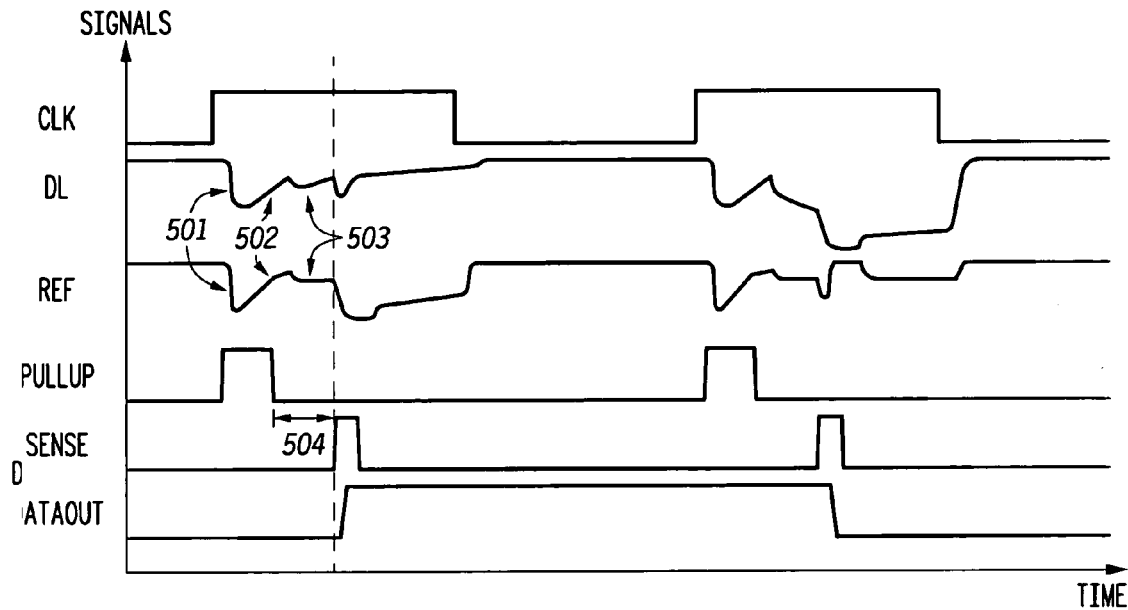
FIG. 5 illustrates a timing diagram illustrating the operation of the memory of FIG. 1 according to an embodiment of the present disclosure.

FIG. 5 illustrates a timing diagram illustrating the operation of the memory of FIG. 1 according to an embodiment of the present disclosure. As illustrated at time 501, DL and REF signals are pulled low towards Vss when the word line becomes active due to the discharge capacitance of their respective memory array bit lines. At time 502, PULLUP signal becomes active, drawing nodes DL and REF up toward a midpoint voltage. At time 503, PULLUP signal becomes inactive allowing nodes DL and REF to separate towards their DC levels unassisted. At time 504, SENSE signal becomes active, enabling the sense amplifier to sense the difference between DL and REF signals. The width of PULLUP signal and the delay between PULLUP becoming inactive and SENSE becoming active (the self timing delay) are finely tuned to balance the need for fast access times and the need to allow the signals to properly reflect the value stored in the memory. For compilable memory, the pulse width of PULLUP signal and the self-timing delay is programmable.

Figure 6:
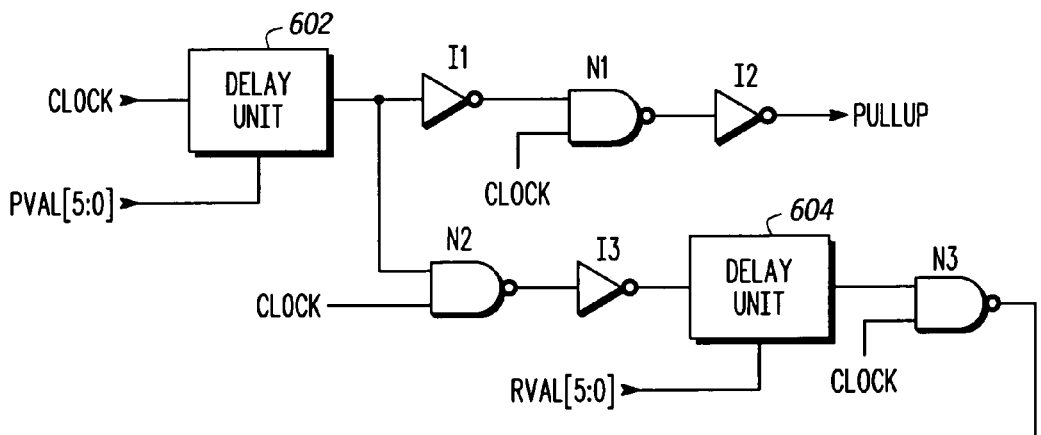
FIG. 6 illustrates, in schematic diagram form, the timing circuit of FIG. 1.
Figure 6:
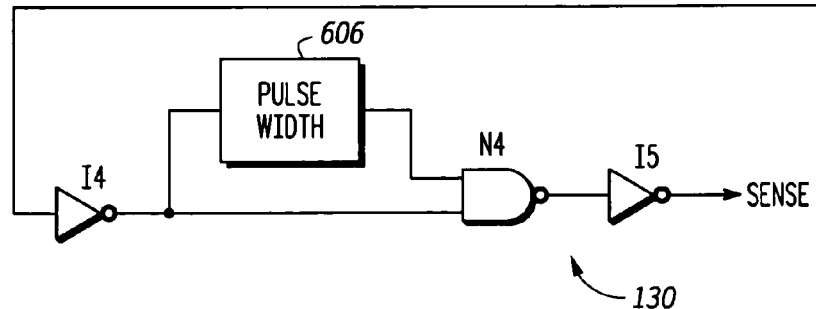

FIG. 6 illustrates, in schematic diagram form, the timing circuit 130 of FIG. 1. Programmable values PVAL[5:0] and RVAL[5:0] control the duration of the charging pulse PULLUP and the enabling of a sense amplifier circuit (the self timing delay). Delay unit 602 sets the width of the bit line PULLUP pulse. Delay unit 604 adds additional delay before triggering the sense amplifier to ensure, for example, at least 100 mV of differential between the DL and REF signals. Pulse width unit 606 sets the width of the sense amplifier trigger signal SENSE to ensure that data is reliably sensed and registered.

During the design of memory using, for example, a CAD tool, a user selects a physical memory size. The CAD tool subroutine calculates appropriate values for PVAL[5:0] and RVAL[5:0] to provide optimal access timing.

Figure 7:
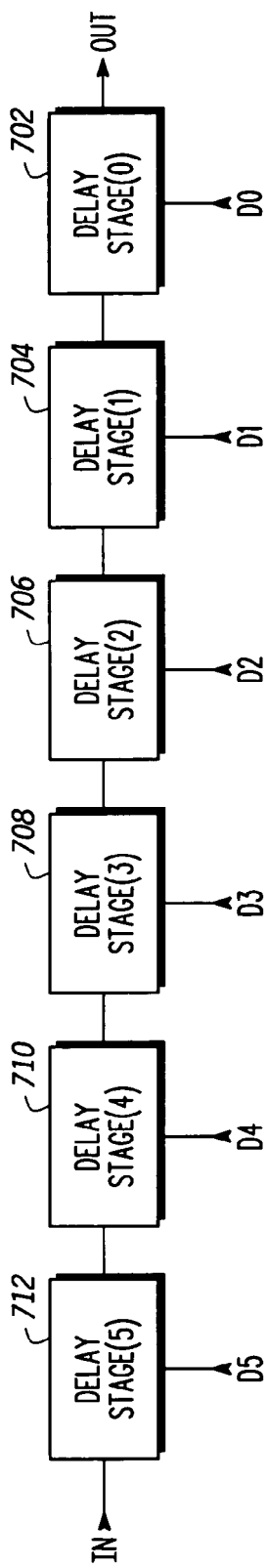
FIG. 7 illustrates, in schematic diagram form, the delay unit of FIG. 6.

FIG. 7 illustrates, in schematic diagram form, the delay unit of FIG. 6 (delay unit 604 or 606). The delay unit has, for example, six delay stages 702, 704, 706, 708, 710, 712. Each delay stage includes a delay path and a non-delay path. A control input signal (D5, D4, D3, D2, D1 or D0) sent to each delay stage controls the selection between the delay path and the non-delay path. For example, if the control input signal Dn is a logic zero, the input to output signal goes through the non-delay path. If the control input signal Dn is a logic one, the input to output signal goes through the delay path. The number of elements in (and therefore the delay of) the non-delay path is the same in each of the six stages. The number of elements in the delay path of each delay stage varies as described below.

Figure 8:
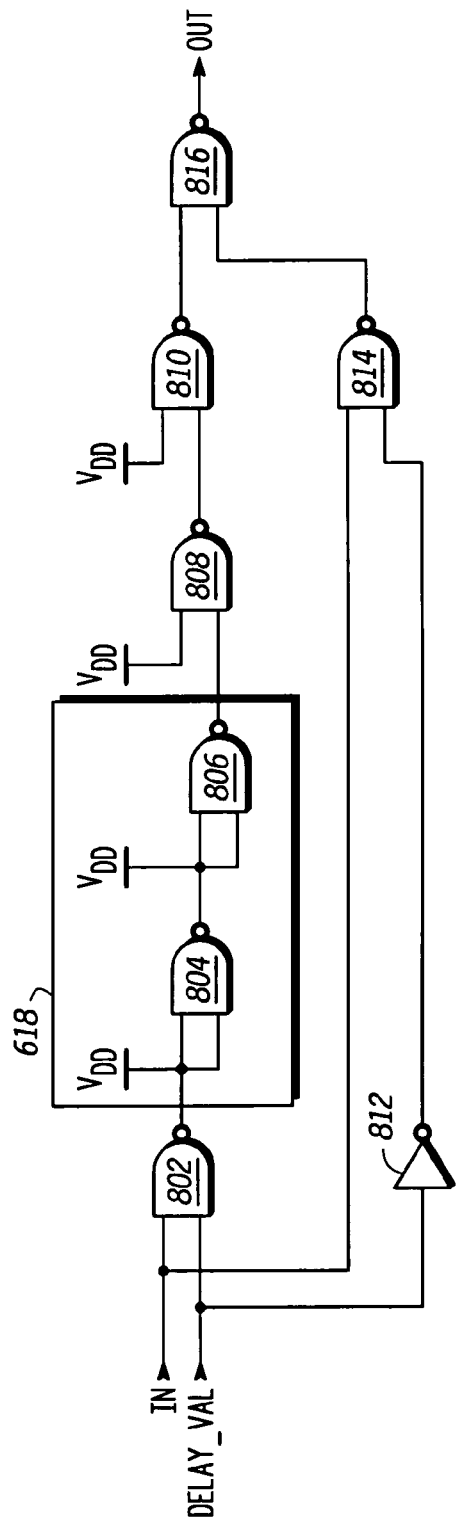
FIG. 8 illustrates, in schematic diagram form, an exemplary delay stage of FIG. 7.

FIG. 8 illustrates, in schematic diagram form, an exemplary delay stage of FIG. 7. The delay path of this exemplary delay stage includes six elements, NAND 802, NAND 804, NAND 806, NAND 808, NAND 810 and NAND 816. The non-delay path (which is the same in all six stages) includes two elements, NAND 814 and NAND 816. Inverter 812 aids in the selection of the delay or non-delay path.

The number of NAND elements in the delay path varies amongst the six delay stages. The delay path includes an intrinsic delay portion including NAND elements 802, 808, 810 and 816. The intrinsic delay portion is the same for each of the six delay stages. The delay path also includes a varying delay portion 618 which include a varying number of NAND pairs from 0 to 31 amongst the six delay stages. In one embodiment of the present disclosure, delay stage 702 includes zero NAND pairs in varying delay portion 618, delay stage 704 includes one NAND pair in varying delay portion 618, delay stage 706 includes three NAND pairs in varying delay portion 618, delay stage 708 includes seven NAND pairs in varying delay portion 618, delay stage 710 includes 15 NAND pairs in varying delay portion 618, and delay stage 712 includes 31 NAND pairs in varying delay portion 618.

The following table illustrates how the total number of NAND gates through which the input signal must pass varies by control value, which likewise controls the input to output delay of the signal.

TABLE 1

| CONTROL VALUE D[5:0] | DELAY STAGE 712 NANDs (66 or 2) | DELAY STAGE 710 NANDs (34 or 2) | DELAY STAGE 708 NANDs (18 or 2) | DELAY STAGE 706 NANDs (10 OR 2) | DELAY STAGE 704 NANDs (6 OR 2) | DELAY STAGE 702 NANDs (4 OR 2) | TOTAL NANDS |
|---|---|---|---|---|---|---|---|
| 000000 | 2 | 2 | 2 | 2 | 2 | 2 | 12 |
| 000001 | 2 | 2 | 2 | 2 | 2 | 4 | 14 |
| 000010 | 2 | 2 | 2 | 2 | 6 | 2 | 16 |
| 000011 | 2 | 2 | 2 | 2 | 6 | 4 | 18 |
| 000100 | 2 | 2 | 2 | 10 | 66 | 2 | 20 |
| 000101 | 2 | 2 | 2 | 10 | 66 | 4 | 22 |
| 000110 | 2 | 2 | 2 | 10 | 6 | 2 | 24 |
| 000111 | 2 | 2 | 2 | 10 | 6 | 4 | 26 |
| 001000 | 2 | 2 | 18 | 2 | 2 | 2 | 28 |
| 001001 | 2 | 2 | 18 | 2 | 2 | 4 | 30 |
| 001010 | 2 | 2 | 18 | 2 | 6 | 2 | 32 |
| 001011 | 2 | 2 | 18 | 2 | 6 | 4 | 34 |
| 001100 | 2 | 2 | 18 | 10 | 66 | 2 | 36 |
| 001101 | 2 | 2 | 18 | 10 | 66 | 4 | 38 |
| 001110 | 2 | 2 | 18 | 10 | 6 | 2 | 40 |
| 001111 | 2 | 2 | 18 | 10 | 6 | 4 | 42 |
| 010000 | 2 | 34 | 2 | 2 | 2 | 2 | 44 |
| 010001 | 2 | 34 | 2 | 2 | 2 | 4 | 46 |
| 010010 | 66 | 34 | 2 | 2 | 6 | 2 | 48 |
| 010011 | 66 | 34 | 2 | 2 | 6 | 4 | 50 |
| 010100 | 66 | 34 | 2 | 10 | 66 | 2 | 52 |
| 010101 | 2 | 34 | 2 | 10 | 66 | 4 | 54 |
| 010110 | 2 | 34 | 2 | 10 | 6 | 2 | 56 |
| 010111 | 2 | 34 | 2 | 10 | 6 | 4 | 58 |
| 011000 | 2 | 34 | 18 | 2 | 2 | 2 | 60 |
| 011001 | 2 | 34 | 18 | 2 | 2 | 4 | 62 |
| 011010 | 2 | 34 | 18 | 2 | 6 | 2 | 64 |
| 011011 | 2 | 34 | 18 | 2 | 6 | 4 | 66 |
| 011100 | 2 | 34 | 18 | 10 | 66 | 2 | 68 |
| 011101 | 2 | 34 | 18 | 10 | 66 | 4 | 70 |
| 011110 | 2 | 34 | 18 | 10 | 6 | 2 | 72 |

TABLE 1-continued

| CONTROL VALUE D[5:0] | DELAY STAGE 712 NANDs (66 or 2) | DELAY STAGE 710 NANDs (34 or 2) | DELAY STAGE 708 NANDs (18 or 2) | DELAY STAGE 706 NANDs (10 OR 2) | DELAY STAGE 704 NANDs (6 OR 2) | DELAY STAGE 702 NANDs (4 OR 2) | TOTAL NANDS |
|---|---|---|---|---|---|---|---|
| 011111 | 2 | 34 | 18 | 10 | 6 | 4 | 74 |
| 100000 | 66 | 2 | 2 | 2 | 2 | 2 | 76 |
| 100001 | 66 | 2 | 2 | 2 | 2 | 4 | 78 |
| 100010 | 66 | 2 | 2 | 2 | 6 | 2 | 80 |
| 100011 | 66 | 2 | 2 | 2 | 6 | 4 | 82 |
| 100100 | 66 | 2 | 2 | 10 | 66 | 2 | 84 |
| 100101 | 66 | 2 | 2 | 10 | 66 | 4 | 86 |
| 100110 | 66 | 2 | 2 | 10 | 6 | 2 | 88 |
| 100111 | 66 | 2 | 2 | 10 | 6 | 4 | 90 |
| 101000 | 66 | 2 | 18 | 2 | 2 | 2 | 92 |
| 101001 | 66 | 2 | 18 | 2 | 2 | 4 | 94 |
| 101010 | 66 | 2 | 18 | 2 | 6 | 2 | 96 |
| 101011 | 66 | 2 | 18 | 2 | 6 | 4 | 98 |
| 101100 | 66 | 2 | 18 | 10 | 66 | 2 | 100 |
| 101101 | 66 | 2 | 18 | 10 | 66 | 4 | 102 |
| 101110 | 66 | 2 | 18 | 10 | 6 | 2 | 104 |
| 101111 | 66 | 2 | 18 | 10 | 6 | 4 | 106 |
| 110000 | 66 | 34 | 2 | 2 | 2 | 2 | 108 |
| 110001 | 66 | 34 | 2 | 2 | 2 | 4 | 110 |
| 110010 | 66 | 34 | 2 | 2 | 6 | 2 | 112 |
| 110011 | 66 | 34 | 2 | 2 | 6 | 4 | 114 |
| 110100 | 66 | 34 | 2 | 10 | 66 | 2 | 116 |
| 110101 | 66 | 34 | 2 | 10 | 66 | 4 | 118 |
| 110110 | 66 | 34 | 2 | 10 | 6 | 2 | 120 |
| 110111 | 66 | 34 | 2 | 10 | 6 | 4 | 122 |
| 111000 | 66 | 34 | 18 | 2 | 2 | 2 | 124 |
| 111001 | 66 | 34 | 18 | 2 | 2 | 4 | 126 |
| 111010 | 66 | 34 | 18 | 2 | 6 | 2 | 128 |
| 111011 | 66 | 34 | 18 | 2 | 6 | 4 | 130 |
| 111100 | 66 | 34 | 18 | 10 | 66 | 2 | 132 |
| 111101 | 66 | 34 | 18 | 10 | 66 | 4 | 134 |
| 111110 | 66 | 34 | 18 | 10 | 6 | 2 | 136 |
| 111111 | 66 | 34 | 18 | 10 | 6 | 4 | 138 |

Referring to the above table, in the exemplary embodiment the input to output delay passes through as few as 12 to as many as 138 NAND gates. One skilled in the art will recognize that alternate embodiments can use various number of delay stages and number of delay elements to provide differing delay ranges.

Note that in FIG. 8 that all logic gates in the delay path are NAND gates. This enables more accuracy in matching delay paths. Also, note that in the non-delay path, the input signal flows through the upper input on NAND 814 and the lower input of NAND 816. In the delay path, the input signal flows through the upper input of NAND 810 and the lower input on NAND 808. Because the upper/lower input delays can vary, the upper/lower inputs of the non-delay path mimic the delay path, helping to ensure linear delay increments across the full range of binary control counts.

A memory compiler can be fully automated to build any customer-determined configuration (within the compiler limits). The values of PVAL and RVAL can be hard wired based upon the specified configuration. Mathematical equations are needed to determine the PVAL and RVAL binary numbers to ensure sufficient sense amplifier differential, combined with the fastest access times possible, for all PVT points.

Figure 9:
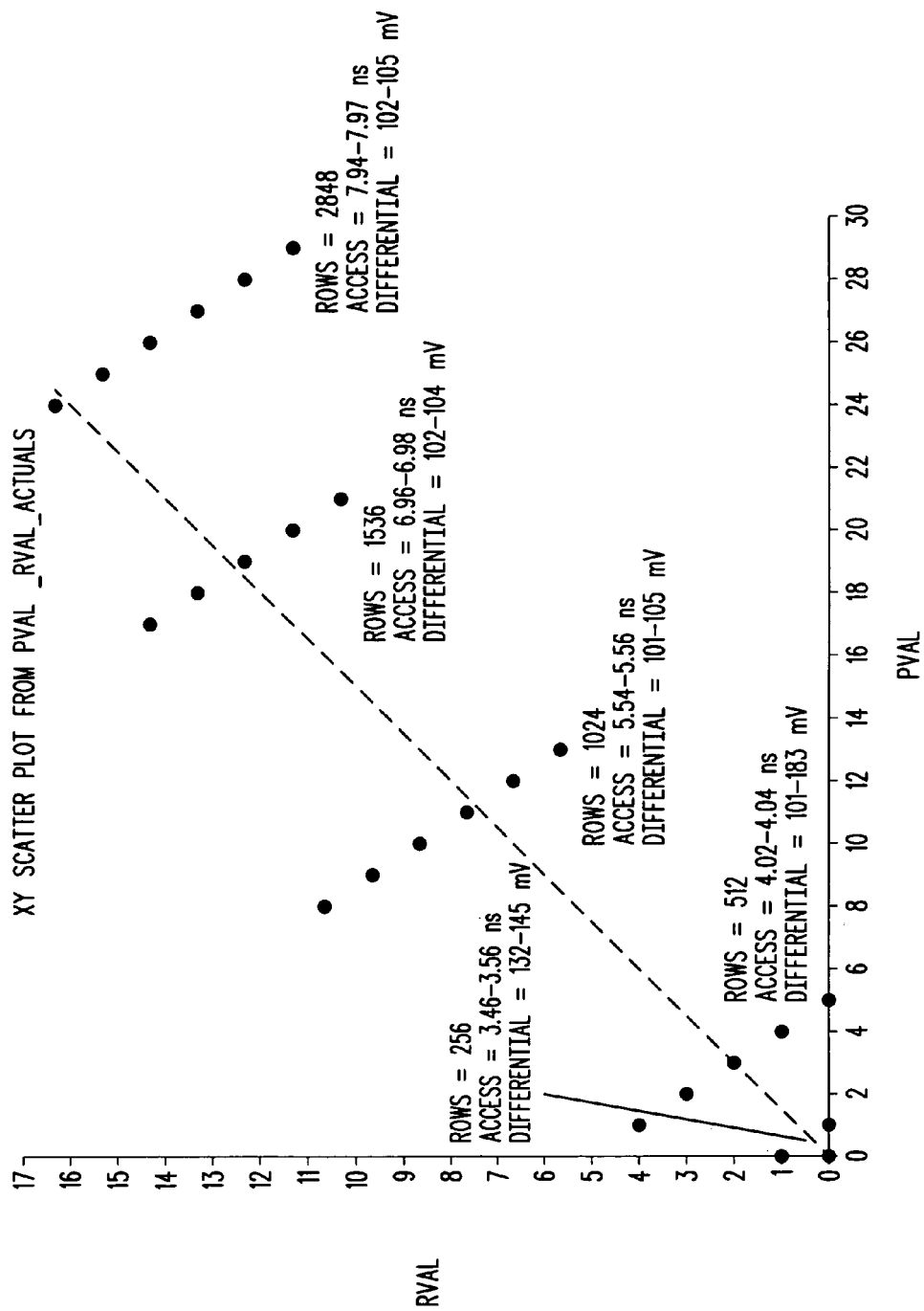
FIG. 9 illustrates an exemplary scatter plot illustrating access times for a variety of charging pulse widths and sense delays according to an embodiment of the present disclosure.

FIG. 9 illustrates an exemplary scatter plot illustrating access timing for a variety of charging pulse widths and sense delays utilized to generate mathematical equations for the determination of PVAL and RVAL. Simulations were performed using a five by five matrix of pulse width values (PVAL) versus self-timing delay values (RVAL) numbers for 256, 512, 1024, 1536 and 2048 rows of memory. Thousands of predicted values were generated to find ranges of points with nearly equal responses for ~100 mV differential at the fastest access times. Multivariate regression analysis on the simulation results can be used to generate mathematical equations for access time and sense amplifier differential. Although the spread of the optimum equivalency distributions is not linear as the number of rows is varied, a linear response can be drawn through all five groups from which linear predictor equations for PVAL and RVAL values can be derived. For example, mathematical equations can be a follows:

$$PVAL = -3.714 + 0.015 * rows$$

$$RVAL = -2.429 + 0.009 * rows$$

As the compiler builds a memory array, the equations determine the settings for PVAL[5:0] and RVAL[5:0] for optimum differential and access time.

It should be understood that the specific steps indicated in the methods herein may be implemented in hardware and/or software. For example, a specific step may be performed using software and/or firmware executed on one or more processing modules. In general, a system for providing images may include a more generic processing module and memory. The processing module can be a single processing device or a plurality of processing devices. Such a processing device may be a microprocessor, microcontroller, digital processor, microcomputer, a portion of the central processing unit, a state machine, logic circuitry, and/or any device that manipulates the signal. The manipulation of these signals is generally based upon operational instructions. The memory may be a single memory device or a plurality of memory devices. Such a memory device may be a read only memory, a random access memory, a floppy disk memory, magnetic tape memory, erasable memory, a portion of a system memory, and/or any device that stores operational instructions in a digital format. Note that when the processing module implements one or more of its functions to be a state machine or logic circuitry, the memory storing in the corresponding operational instructions is embedded within the circuitry comprising the state machine and/or other logic circuitry. For example, such a system may be a circuit design tool having a compilable memory unit to facilitate implementation of memories as described herein.

The above-disclosed subject matter is to be considered illustrative, and not restrictive, and the appended claims are intended to cover all such modifications, enhancements, and other embodiments that fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method comprising:
    discharging a plurality of bit lines during an inactive memory access period;
    applying a charging pulse on a select one of the plurality of bit lines; and
    after applying the charging pulse, waiting a delay time before sensing a voltage difference between the select one of the plurality of bit lines and a reference line, the delay time sufficient to allow the select one of the plurality of bit lines to be pulled towards a voltage level corresponding to a stored value in a selected memory bit cell.

2. The method, as recited in claim 1, wherein the charging pulse has a width and the sensing occurs during a delay after the charging pulse, wherein the width and the delay are determined according to a size of a memory.

3. The method, as recited in claim 1, wherein the charging pulse has a width and the sensing occurs during a delay after the charging pulse, wherein the memory is a compilable memory and the width and the delay are calculatable according to a selectable size of a memory.

4. The method, as recited in claim 1, wherein the voltage difference is greater than or equal to 100 millivolts.

5. The methods as recited in claim 1, wherein the voltage difference is greater than or equal to 150 millivolts.

6. The method, as recited in claim 1, further comprising: applying another charging pulse on the reference line.

7. The method, as recited in claim 1, further comprising: discharging the reference line during the inactive memory access period.

8. The method, as recited in claim 1, wherein applying the charging pulse on the select one of the plurality of bit lines draws a voltage of the select one of the plurality of bit lines to a midpoint voltage level.

9. The method, as recited in claim 1, further comprising: applying a charging pulse on the reference line, wherein applying the charging pulse on the reference lines draws a voltage of the reference line to a midpoint voltage level.

10. The method, as recited in claim 1, wherein after applying the charging pulse on the select one of the plurality of bit lines and before sensing the voltage difference, a voltage of the select one of the plurality of bit lines is drawn to a voltage level by a stored value in a selected memory bit cell.

11. A method comprising:
    discharging a plurality of bit lines during an inactive memory access period;
    applying a charging pulse on a select one of the plurality of bit lines; and
    after applying the charging pulse, waiting a delay time before sensing a voltage difference between the select one of the plurality of bit lines and the reference line, the delay time sufficient to allow the reference line to be pulled towards a reference voltage.

12. A memory array comprising:
    a plurality of bit lines;
    a plurality of discharge transistors, each of the plurality of discharge transistors coupled one-to-one to a corresponding bit line of the plurality of bit lines, wherein the plurality of discharge transistors are configured to discharge the plurality of bit lines to a logic low during an inactive memory access period, wherein a selected discharge transistor of the plurality of discharge transistors is configured to stop discharging a selected bit line of the plurality of bit lines during an active memory access period;
    a plurality of passgate transistors configured as a multiplexer, each of the plurality of passgate transistors coupled one-to-one to the corresponding bit line of the plurality of bit lines, the plurality of passgate transistors configured to select one of the plurality of bit lines as a sensed node; and
    a pull-up transistor coupled to the sensed node, the pull-up transistor configured to provide a charging pulse to the sensed node upon entering the active memory access period.

13. The memory array, as recited in claim 12, further comprising:
    a sense amplifier coupled to the sensed node and a reference node, the sense amplifier configured to sense a difference between a voltage level on the sensed node and a voltage level on the reference node.

14. The memory array, as recited in claim 13, wherein the difference is at least 100 millivolts.

15. The memory array, as recited in claim 13, wherein the charging pulse has a width, wherein the sense amplifier is configured to sense to difference during a delay period alter the charging pulse, and wherein the width and the delay period are determined according to a size of the memory array.

16. The memory array, as recited in claim 13, wherein to charging pulse has a width, wherein the sense amplifier is configured to sense the difference during a delay period after the charging pulse, and wherein the memory array is a compilable memory and the width and the delay are calculatable according to a selectable physical size of the memory array.

17. The memory array, as recited in claim 16, further comprising:
    a pulse width selectable delay unit, wherein the pulse width selectable delay unit is configured to produce to delay period by selecting one or more units of pulse delay devices according to a mathematical equation based on the selectable size of the memory array; and
    a delay period selectable delay unit, wherein the delay period selectable delay unit is configured to produce the delay period by selecting one or more units of period delay devices according to the mathematical equation.

18. The memory array, as recited in claim 13, wherein the charging pulse has a width, wherein the sense amplifier is configured to sense the difference during a delay period after the charging pulse, and wherein the delay period is sufficient to allow the sensed node to be pulled towards a voltage level corresponding to a stored value in a selected memory bit cell of the memory array.

19. The memory array, as recited in claim 13, further comprising:
reference circuitry configured to generate the reference node; wherein the reference circuitry is configured to discharge the reference node low during the inactive memory access period and provide another charging pulse to the sensed node upon entering the active memory access period.

20. The memory array, as recited in claim 12, wherein the pull-up transistor coupled to the sensed node draws a voltage of the sense node to a midpoint voltage level.

21. A circuit design tool comprising;
a compilable memory unit;
wherein a user can select a size of a memory unit to be included in a circuit design;
wherein the compilable memory unit comprises a set of instructions configured to:
calculate a delay period and a pulse width based on the size of the memory unit;
create the memory unit, wherein the memory unit comprises:
a plurality of bit lines;
a plurality of discharge transistors, each of the plurality of discharge transistors coupled to a corresponding one of the plurality of bit lines, wherein the plurality of discharge transistors are configured to discharge the plurality of bit lines to a logic low during an inactive memory access period, wherein a selected discharge transistor of the plurality of discharge transistors is configured to stop discharging a selected bit line of the plurality of bit lines during an active memory access period;
a plurality of passgate transistors configured as a multiplexer, a respective one of the plurality of passgate transistors coupled to each of the plurality of bit lines, the plurality of passgate transistors configured to select one of the plurality of bit lines as a sensed node; and
a pull-up transistor coupled to the sensed node, the pull-up transistor configured to provide a charging pulse having the pulse width to the sensed node upon entering the active memory access period.

22. The circuit design tool, as recited in claim 21, wherein the memory unit further comprises:
a sense amplifier coupled to the sensed node, the sense amplifier configured to sense a difference between a voltage level on the sensed node and a voltage level on a reference node during the delay period after the charging pulse.

23. A circuit design tool comprising:
a compilable memory unit;
wherein a user can select a size of a memory unit to be included in a circuit design;
wherein the compilable memory unit comprises a set of instructions configured to:
calculate a delay period and a pulse width based on the size of the memory unit; provide the memory unit;
wherein the memory unit is configured to:
discharge a plurality of bit lines during an inactive memory access period;
apply a charging pulse on a select one of the plurality of bit lines; and
sensing a voltage difference between the select one of the plurality of bit lines and a reference line;
wherein the clinging pulse has a width of the pulse width and the sensing occurs during the delay period after the charging pulse.

* * * * *

UNITED STATES PATENT AND TRADEMARK OFFICE
CERTIFICATE OF CORRECTION

| | | |
|---|---|---|
| PATENT NO. | : 7,050,354 B2 | |
| APPLICATION NO. | : 10/737058 | |
| DATED | : May 23, 2006 | |
| INVENTOR(S) | : James W. Nicholes | |

It is certified that error appears in the above-identified patent and that said Letters Patent is hereby corrected as shown below:

Column No. 9, Line No. 50 change "methods" to --method,--

Column No.10, Line No. 48 change "alter" to --after--

Column No. 10, Line No. 52 change "to" to --the--

Column No. 10, Line No. 62 change "to" to --the--

Column No. 11, Line No. 20 change "sense" to --sensed--

Column No. 12, Line No. 37 change "clinging" to --charging--

Signed and Sealed this

Fifteenth Day of August, 2006

JON W. DUDAS
*Director of the United States Patent and Trademark Office*